(12) United States Patent
Wang et al.

(10) Patent No.: US 7,187,915 B2
(45) Date of Patent: Mar. 6, 2007

(54) AUTOMATIC GAIN CONTROL FOR A WLAN SYSTEM

(75) Inventors: Chih-Chia Wang, Taichung (TW); Kai-Pon Kao, Hsinchu (TW)

(73) Assignee: Via Technologies, Inc., Taipei (TW)

( * ) Notice: Subject to any disclaimer, the term of this patent is extended or adjusted under 35 U.S.C. 154(b) by 353 days.

(21) Appl. No.: 10/952,035

(22) Filed: Sep. 28, 2004

(65) Prior Publication Data

US 2006/0068733 A1    Mar. 30, 2006

(51) Int. Cl.
*H04B 1/06*    (2006.01)

(52) U.S. Cl. .................................... 455/234.1; 375/345

(58) Field of Classification Search .............. 455/234.1, 455/234.2, 239.1, 240.1, 241.1, 245.2, 247.1, 455/250.1, 251.1, 253.2; 375/345
See application file for complete search history.

(56) References Cited

U.S. PATENT DOCUMENTS 5,563,916 A * 10/1996 Scarpa ....................... 375/345
2006/0094384 A1 * 5/2006 Rouphael et al. ......... 455/234.1

* cited by examiner

*Primary Examiner*—Lee Nguyen
(74) *Attorney, Agent, or Firm*—Thomas, Kayden, Horstemeyer & Risley

(57) ABSTRACT

An Automatic Gain Control (AGC) method and system thereof. The power of a detected signal is first checked to ensure that it is large enough for AGC process. A power average of the detected signal is computed and compared to a first threshold in order to determine whether to proceed with a coarse tune procedure or enter a fine tune procedure. Both Low Noise Amplifier (LNA) gain and Variable Gain Amplifier (VGA) gain are tuned during coarse tune, whereas only the VGA gain is tuned during fine tune. The LNA and VGA gains are tuned to predetermined values during coarse tune, and the VGA gain is adjusted according to a difference between a computed average of power and a second threshold.

32 Claims, 6 Drawing Sheets

AUTOMATIC GAIN CONTROL FOR A WLAN SYSTEM

BACKGROUND

The present invention relates to an Automatic Gain Control (AGC) method, and more specifically, to an AGC method suitable for use in a Wireless Local Area Network (WLAN).

An automatic Gain Control (AGC) method is a process by which gain is automatically adjusted in a specified manner as a function of a specified parameter, such as received signal level. The gain is defined as the increase in the amplitude of an electrical signal from the original input to the amplified output. The following describes two exemplary AGC algorithms, binary tree search and RSSI-base, common AGC methods used in wireless communication receivers.

FIG. 1 illustrates the binary tree search AGC algorithm. The circuit is programmed to search the possible gain settings of Low Noise Amplifier (LNA) and Variable Gain Amplifier (VGA) in a binary fashion to quickly determine the final gain settings needed to optimize the inputs to the Analog/Digital (A/D) converters for demodulation. The LNA is for coarse gain adjustment, and the VGA is for fine gain adjustment. The binary tree search AGC algorithm is completely controlled by the detection of saturation of the A/D converter. The saturation of the A/D converter is determined by whether the digital word reaches a predetermined maximum/minimum value. The circuit implementing the binary tree search AGC algorithm initially sets the VGA and LAN pins to a predetermined maximum gain condition. Upon detection of A/D saturation, the circuit decreases the system gain via the VGA pin to a predetermined midpoint. The midpoint is chosen to allow the circuit to determine the correct setting of the LNA pin. If the circuit detects saturation at this midpoint, the circuit places the Radio Frequency (RF) front end to a low gain mode, and begins searching for the correct VGA setting in a binary tree fashion. If the circuit does not detect saturation on the A/D converters at this midpoint, the circuit leaves the LNA pin in the high gain mode and proceeds with the binary search of VGA. This binary tree representation of the AGC algorithm can also be illustrated by the AGC decision structure shown in FIG. 2. It is important to note that once the circuit makes a decision on the LNA setting, this LNA setting will remain for the entire duration of a packet transmission and will not be altered until the next packet. As shown in FIG. 2, the binary tree search AGC algorithm adjusts its gain by selecting one of two possible paths in every period. In order to achieve satisfactory gain accuracy, the required convergence time is relatively long.

FIG. 3 is a flowchart illustrating the RSSI-base AGC algorithm. A Received Signal Strength Indicator (RSSI) voltage is available as reference for gain adjustment in order to speed the gain control algorithm. The signal detected by the RSSI block is taken from the output of the base band analog IQ low-pass channel filters. The RSSI output level is directly dependent on the gain setting of the RF section. The gain setting of the base band AGC, however, has no impact on the RSSI output, since the input signal to the RSSI block is taken from before the base band AGC block. The RSSI-base AGC algorithm does not require analog to digital conversion since the gain can be fully controlled at the analog base band section of the receiver. The RSSI-base AGC algorithm, however, is only suitable for receivers comprising the RSSI function in the base band section. Unfortunately, not all RFIC venders provide RSSI function for base band transmission.

SUMMARY

Accordingly, an object of the present invention is to provide an Automatic Gain Control (AGC) algorithm which shortens the AGC convergence timeline compared to binary tree search, consequently, providing suitability with Wireless Local Area Network (WLAN) defined in IEEE 802.11 a/b/g. The AGC algorithm achieves gain convergence within a short period of time since the short-preamble defined in IEEE 802.11 a/b/g is relatively short. The AGC algorithm tunes gain of the amplifiers in order to determine the amplitude of the signal for the Analog to Digital Converter (ADC) to fully receive the signal.

Another object of the present invention is to provide an AGC circuit not requiring information from RSSI.

An embodiment of the present invention provides an Automatic Gain Control (AGC) method for tuning Low Noise Amplifier (LNA) and Variable Gain Amplifier (VGA) gains without the aid of the RSSI. The AGC method can be generally divided into detection procedure, coarse tune procedure, and fine tune procedure. The LNA gain and VGA gain are initialized according to preset upper boundaries LNA0 and VGA0 respectively before the detection procedure. The power of a signal is detected and compared to a first power level until it exceeds the first power level during the detection procedure. The first power level must be greater than an average noise power. The AGC method then begins the coarse tune procedure and tunes the LNA gain and VGA gain to maximum preset values LNA1 and VGA1. A second power level is computed according to an average power of the detected signal, to determine whether the coarse tune procedure should be terminated. The AGC method proceeds with the coarse tune procedure when the second power level exceeds a first threshold, otherwise entering the fine tune procedure. The LNA gain and VGA gain are tuned to medium preset values LNA2 and VGA2 and the second power level is recalculated if the second power level exceeds the first threshold. The recalculated second power level compared with the first threshold again, similarly, tuning the gains to minimum preset values LNA3 and VGA3 if the recalculated second power level exceeds the first threshold, otherwise entering the fine tune procedure. The LNA gain will not be further tuned in the fine tune procedure. A third power level is computed according to an average power of the detected signal when entering the fine tune procedure. The VGA gain is then fine tuned according to a difference between the third power level and a second threshold.

The present invention provides fully digital AGC design, which does not require any Radio Frequency (RF) feedback, and is ideal for all types of RF Integrated Circuit (IC) from different vendors. In one embodiment, the LNA gain is always tuned to a smaller value than the original value (LNA0>=LNA1>=LNA2>=LNA3) since the discharge time for the amplifier is shorter than the charge time.

BRIEF DESCRIPTION OF THE DRAWINGS

A embodiment of the present invention can be more fully understood by reading the subsequent detailed description in conjunction with the examples and references made to the accompanying drawings, wherein.

DETAILED DESCRIPTION

Figure 1:
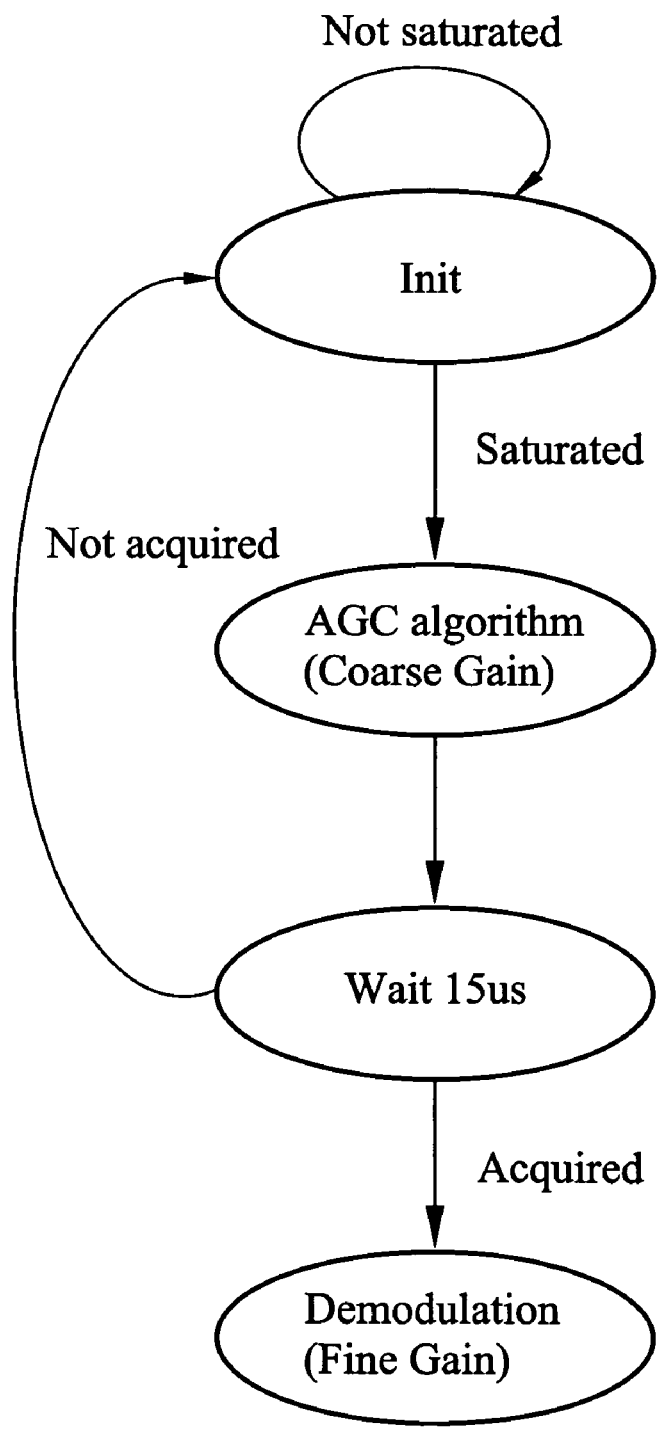
FIG. 1 is a flowchart illustrating a conventional binary tree search AGC method.
Figure 2:
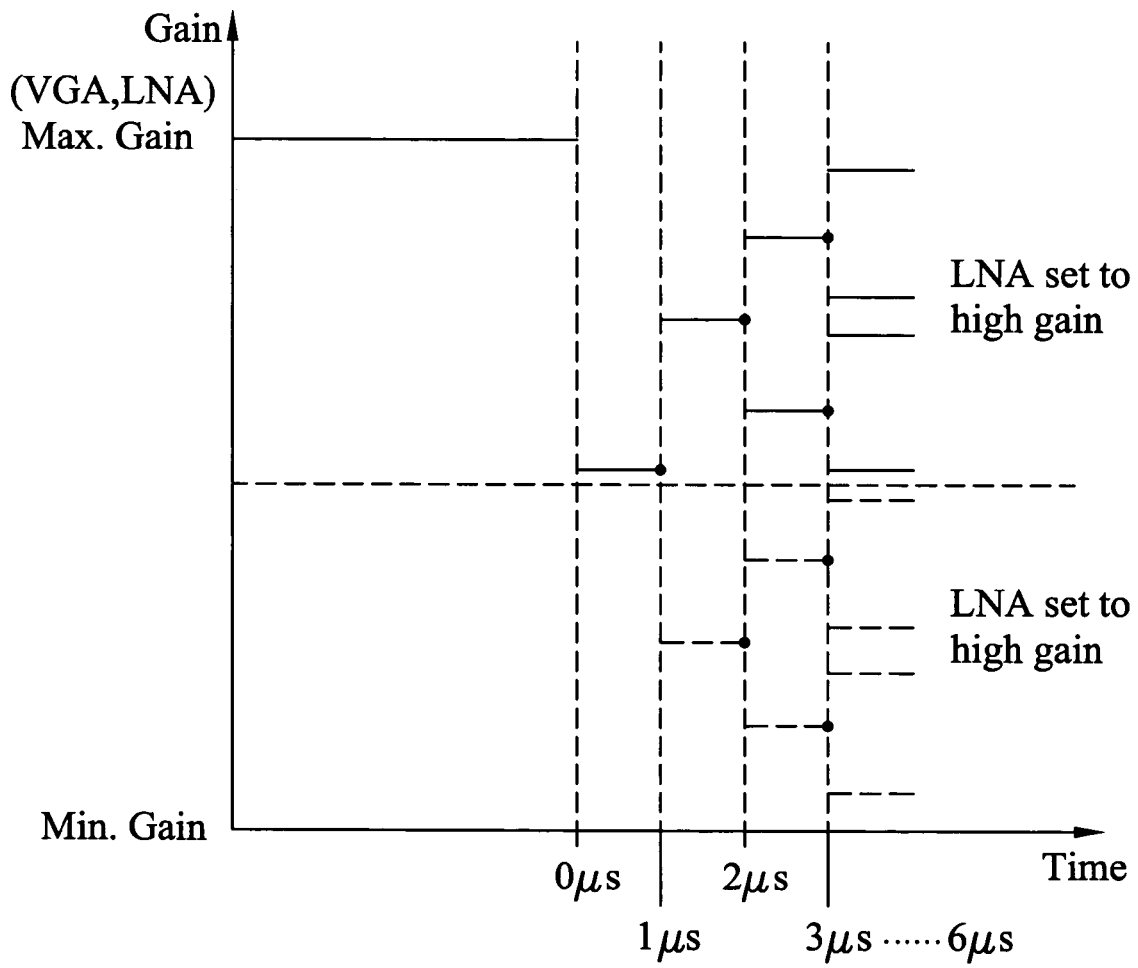
FIG. 2 illustrates a conventional AGC decision structure.
Figure 3:
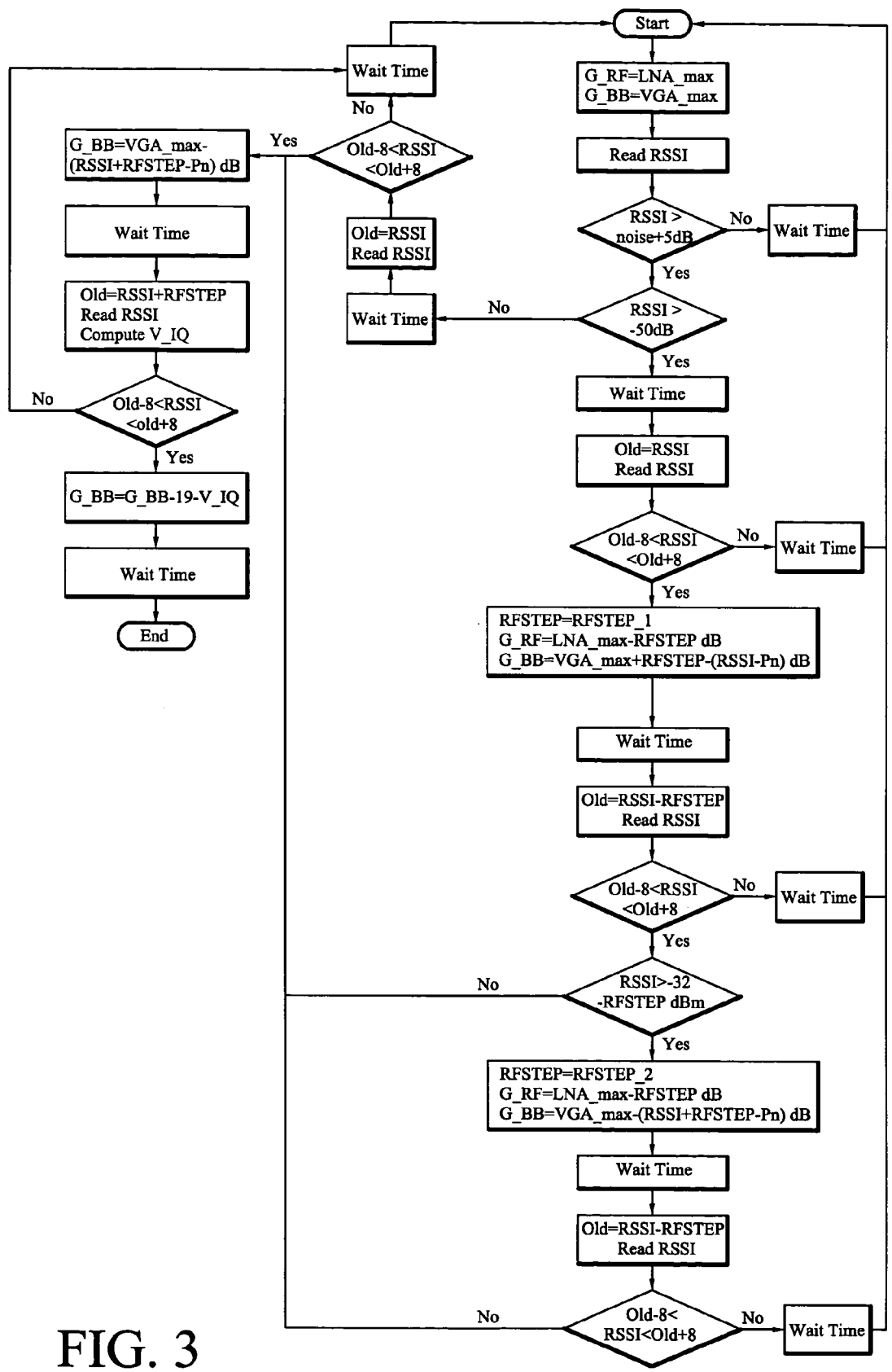
FIG. 3 is a flowchart illustrating a conventional RSSI-base AGC method.
Figure 4A:
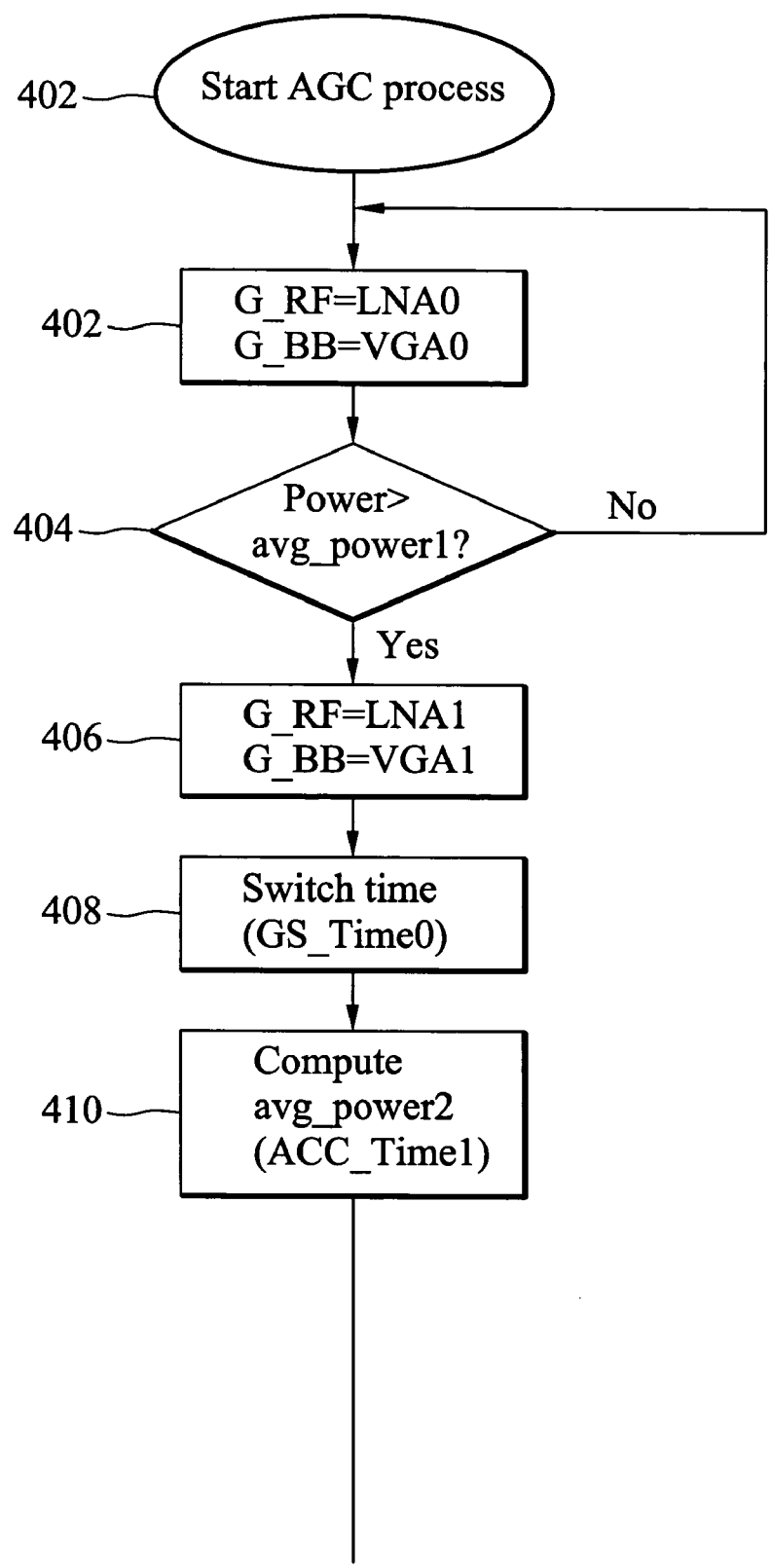
FIGS. 4a~4b show a flowchart illustrating an AGC method according to an embodiment of the present invention.
Figure 4B:
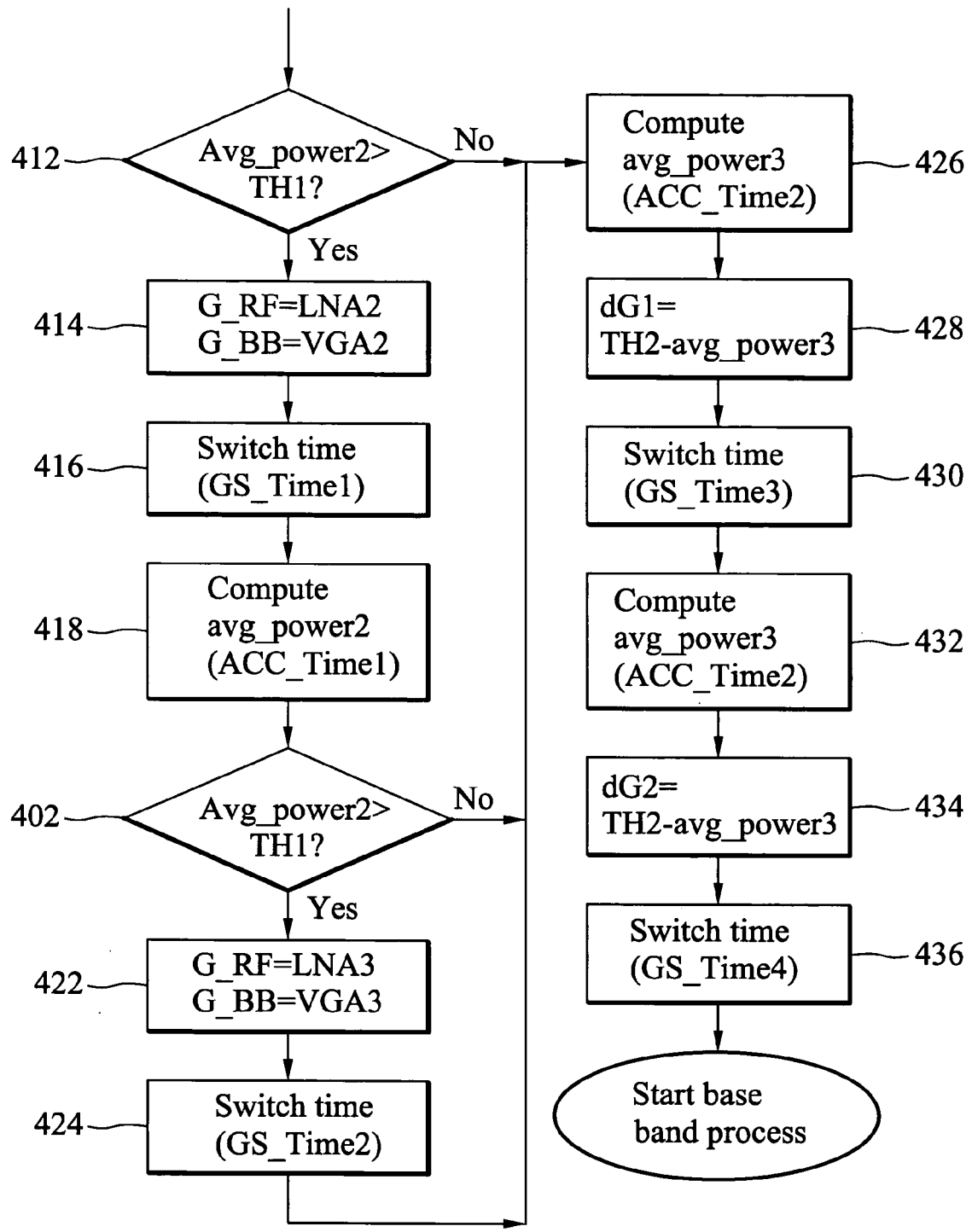

FIGS. 4a~4b illustrate the steps of an AGC method in an embodiment of the present invention. G_RF denotes the radio frequency gain, also referred to as the gain of the Low Noise Amplifier (LNA), where G_BB denotes the base band gain, also referred to as the gain of the Variable Gain Amplifier (VGA). These two gains G_RF and G_BB are initialized to preset upper boundaries LNA0 and VGA0 in step 402. The power of the detected signal is compared to a first power level avg_power1 in step 404, wherein the detected power is the sum of real component square and imaginary component square, and avg_power1 is an ideal power average exceeding an average noise power. In an embodiment of the present invention, avg_power1 is assumed to be a 16-point average of power. A positive result of step 404 (power>avg_power) directs the AGC method to a coarse tune procedure as the detected power is considered sufficient to execute AGC process.

The coarse tune procedure comprises steps 406 to 424, and, as shown in step 406, the gains G_RF and G_BB are tuned to maximum preset values LNA1 and VGA1 respectively. The system requires gain switching times GS_TimeX (step 408, 416, 424, 430, and 436) for changing the gains. The values of GS_Time0~GS_Time4 depend on different RF chips, for example, all the gain switching times are around 0.4 µs in the case of Maxim RF. Next, an average power avg_power2 is computed in step 410, used to determine whether to proceed with the coarse tune procedure or enter the fine tune procedure by comparison with a first threshold TH1. In an embodiment of the present invention, avg_power2 is a 16-point power average. Step 410 takes up a period of accumulated time ACC_Time1 to compute avg_power2 for the gain decision. ACC_Time1 is approximately 0.4 µs when avg_power2 is the average of 16 samples and the system clock is 40 MHz. The first threshold TH1 is computed according to an ideal power of 16 samples with a gain allowance, for example, an ideal 16 sample power of −7 dB and a gain allowance of 15 dB set TH1 to be 8 dB (−7 dB+15 dB). The gain allowance is set to define the fine tune range for tuning the VGA, with a power less than TH1 indicating tuned gain is close enough to the target gain, indicating execution of the fine tune procedure.

If avg_power2 is less than or equal to TH1 in step 412, indicating the current gain is approaching the target gain, the AGC process terminates the coarse tune procedure and executes steps 426 to 436 for fine tune. Otherwise gains G_RF and G_BB are tuned to medium preset values LNA2 and VGA2 respectively in step 414. avg_power2 is recalculated in step 418 and compared to TH1 in step 420, and similarly, the coarse tune procedure may be terminated if avg_power 2 obtained in step 418 is less than or equal to TH1 in step 420. The gains G_RF and G_BB are tuned to minimum preset values LNA3 and VGA3 respectively in step 422 if the recalculated avg_power2 still exceeds than TH1.

In the fine tune procedure, a third average power avg_power3 is first computed in step 426, taking accumulating time ACC_Time2. In an embodiment of the present invention, avg_power3 is the power of 32-point average, thus ACC_Time2 is assumed to be twice as long as ACC_Time1, i.e. 0.8 µs. After obtaining avg_power3, a difference dG1 between a second threshold TH2 and avg_power3 is computed in step 428. In an embodiment of the present invention, the second threshold TH2 is computed according to an ideal power of 32 samples, and is 3 dB higher than TH1 if TH1 is the ideal power of 16 samples. The difference dG1 computed in step 428 represents the amount in decibels for increasing the VGA gain (G_BB). The avg_power3 is computed again in step 432 to further fine tune the VGA gain according to the difference dG2 between TH2 and the recalculated avg_power3. The AGC method is accomplished after fine tuning the VGA gain twice, and the base band process may begin thereafter.

Figure 5:
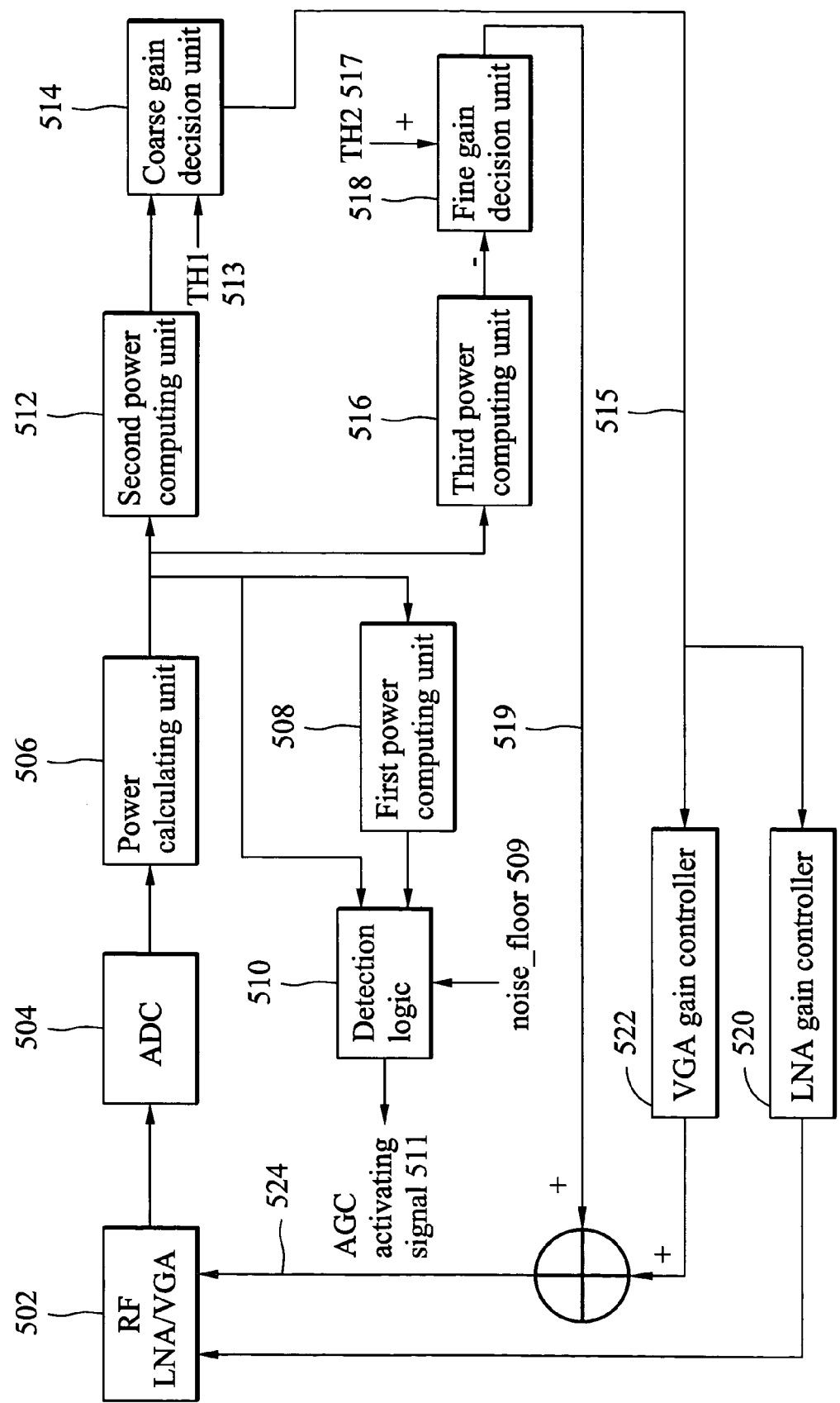
FIG. 5 is a block diagram illustrating an apparatus for AGC according to an embodiment of the present invention.

An embodiment of the present invention also proposes a system for AGC as shown in FIG. 5. An RF signal is received through LNA/VGA amplifiers 502 and Analog to Digital Converter (ADC) 504, the power of the signal is computed in a power calculation unit 506. A first power computing unit 508 calculates an ideal 16-point average for the received power and outputs a first power level avg_power1 to the detection logic 510. The first power level must exceed an average noise power "noise floor" 509. The detection logic 510 compares the detected power from the power calculation unit 506 and avg_power1 from the first power computing unit 508, and outputs an AGC activating signal 511 if the detected power exceeds avg_power1. The AGC activating signal 511 activates the AGC process starting with coarse tune. A second power computing unit 512 calculates and outputs the power of 16-point average avg_power2 to a coarse gain decision unit 514. The coarse gain decision unit compares avg_power2 to a first threshold TH1 513, if avg_power2 exceeds TH1 513, it triggers a LNA gain controller 520 and a VGA gain controller 522 to tune the gains of the amplifiers 502 by outputting a coarse tune signal 515. Such coarse tune can be repeated twice to diminish the gain.

Once avg_power2 is less than or equal to TH1 313, a third power computing unit 516 calculates and outputs the power of 32-point average avg_power3 to a fine gain decision unit 518. The fine gain decision unit 518 subtracts avg_power3 from a second threshold 517 to obtain a fine tune signal 519. The fine tune signal 519 further adjusts the VGA gain through an adder 524 that sums the output of the VGA gain controller 522 and the fine tune signal 519.

Finally, while an embodiment of the invention has been described by way of example and in terms of the above, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An Automatic Gain Control (AGC) method, comprising:
setting a gain of a Low Noise Amplifier (LNA) and a gain of a Variable Gain Amplifier (VGA) according to preset upper boundaries LNA0 and VGA0 respectively;
detecting and comparing the power of a signal to a first power level until it exceeds the first power level, wherein the first power level exceeds an average noise power;

tuning the gains of the LNA and the VGA according to maximum preset values LNA1 and VGA1;

computing a second power level depending on an average power of the signal;

comparing the second power level to a first threshold, and moving to execute fine tune procedures if the second power level is less than or equal to the first threshold;

tuning the gain of the LNA and the VGA according to medium preset values LNA2 and VGA2 if the second power level exceeds the first threshold;

recalculating the second power level and comparing it to the first threshold, if the recalculated second power level is less than or equal to the first threshold, moving to execute fine tune procedures;

tuning the gain of the LNA and the VGA according to minimum preset values LNA3 and VGA3 if the recalculated second power level exceeds the first threshold;

beginning fine tune procedures by computing a third power level depending on an average power of the signal; and tuning the gain of the VGA according to a difference between the third power level and a second threshold.

2. The AGC method according to claim 1, wherein the first power level is an ideal 16-point average power predetermined by the system.

3. The AGC method according to claim 1, wherein the AGC process is accomplished by digital computation.

4. The AGC method according to claim 3, wherein the second power level, the third power level, the first threshold, the second threshold, and the LNA and VGA gains are represented in logarithm unit decibels.

5. The AGC method according to claim 1, wherein the second power level is obtained by calculating a 16-point average power of the signal.

6. The AGC method according to claim 5, wherein the first threshold is determined by considering a gain allowance and an ideal power level of 16 sample points.

7. The AGC method according to claim 1, wherein the third power level is obtained by calculating a 32-point average power of the signal.

8. The AGC method according to claim 7, wherein the second threshold is determined by an ideal power level of 32 sample points.

9. The AGC method according to claim 1, wherein the preset upper boundary for the LNA gain (LNA0) is greater than or equal to the maximum preset value for the LNA gain (LNA1), LNA1 is greater than or equal to the middle preset value for the LNA gain (LNA2), and LNA2 is greater or equal to the minimum preset value for the LNA gain (LNA3).

10. The AGC method according to claim 1, further comprising recalculating the third power level and tuning the gain of the VGA according to a difference between the recalculated third power level and the second threshold.

11. A system for Automatic Gain Control (AGC), comprising:

a detection logic, detecting and comparing the power of a signal to a first power level, and outputting an AGC activating signal when the detected power exceeds the first power level, wherein the first power level exceeds an average noise power;

a Low Noise Amplifier (LNA) gain controller, initializing an LNA gain to a preset upper boundary LNA0, tuning the LNA gain to a maximum preset value LNA1 if the detection logic outputs the AGC activating signal, and sequentially to a medium preset value VNA2 and a minimum preset value LNA3 if receiving a coarse tune signal;

a Variable Gain Amplifier (VGA) gain controller, initializing a VGA gain to a preset upper boundary VGA0, tuning the VGA gain to a maximum preset value VGA1 if the detection logic outputs the AGC activating signal, sequentially to a medium preset value VNA2 and a minimum preset value LNA3 if receiving the coarse tune signal, and further tuning the VGA gain according to a fine tune signal;

a second power computing unit, calculating a second power level depending on an average power of the signal;

a coarse gain decision unit, comparing the second power level to a first threshold, instructing the LNA and VGA gain controllers to tune the gains to LNA2 and VGA2 respectively by sending the coarse tune signal and requesting the second power computing unit to recalculate the second power level if the second power level exceeds the first threshold, then comparing the recalculated second power level to the first threshold, instructing the LNA and VGA gain controllers to tune the gain to LNA3 and VGA3 respectively by sending the coarse tune signal if the recalculated second power level exceeds the first threshold;

a third power computing unit, calculating a third power level depending on an average power of the signal; and a fine gain decision unit, instructing the VGA gain controller to tune the VGA gain according to a difference between the third power level and a second threshold as the fine tune signal.

12. The system for AGC according to claim 11, further comprising a first power computing unit calculating the first power level according to an ideal 16-point average power.

13. The system for AGC according to claim 11, wherein the AGC apparatus is a digital implementation.

14. The system for AGC according to claim 13, wherein the second power level, the third power level, the first threshold, the second threshold, and the LNA and VGA gains are represented in logarithm unit decibels.

15. The system for AGC according to claim 11, wherein the second power computing unit obtains the second power level by calculating a 16-point average power of the signal.

16. The system for AGC according to claim 15, wherein the first threshold is determined by considering a gain allowance and an ideal power level of 16 sample points.

17. The system for AGC according to claim 11, wherein the third power computing unit obtains the third power level by calculating a 32-point average power of the signal.

18. The system for AGC according to claim 17, wherein the second threshold is determined by an ideal power level of 32 sample points.

19. The system for AGC according to claim 11, wherein the preset upper boundary for the LNA gain (LNA0) is greater than or equal to the maximum preset value for the LNA gain (LNA1), LNA1 is greater than or equal to the middle preset value for the LNA gain (LNA2), and LNA2 is greater or equal to the minimum preset value for the LNA gain (LNA3).

20. The system for AGC according to claim 11, wherein the fine gain decision unit instructs the third power computing unit to recalculate the third power level and retune the VGA gain according to a difference between the recalculated third power level and the second threshold.

21. An Automatic Gain Control (AGC) method of controlling a wireless receiver having a gain of a Low Noise Amplifier (LNA) and a gain of a Variable Gain Amplifier (VGA) for determining a final gain setting LNAFinal and VGAFinal of the LNA and VGA, comprising:
  (i) setting initial gains for the LNA and the VGA corresponding to a maximum gain;
  (ii) detecting and determining whether the power of a received RF signal is within a valid receiving range;
  (iii) coarse-tuning the gains of the LNA and the VGA according to a subsequent preset value if the power of the received RF signal is not within the valid receiving range; wherein a plurality of preset values for the gains are arranged in order so that the subsequent preset value is lower than the antecedent preset value;
  (iv) repeating steps (ii) and (iii) if the power of the received RF signal is still outside the valid receiving range, else fixing the current gain of the LNA as LNAFinal;
  (v) computing an average power of the received RF signal; and
  (vi) fine-tuning the gain of the VGA to be VGAFinal according to a difference between the average power and a threshold.

22. The AGC method according to claim 21, wherein the valid receiving range is set according to an ideal 16-point average power predetermined by the system.

23. The AGC method according to claim 21, wherein the AGC process is accomplished by digital computation.

24. The AGC method according to claim 21, wherein the average power level is obtained by calculating a 32-point average power of the signal.

25. The AGC method according to claim 24, wherein the threshold is determined by an ideal power level of 32 sample points.

26. The AGC method according to claim 21, further comprising:
  (vii) recalculating the average power level and tuning the gain of the VGA according to a difference between the recalculated average power level and the threshold.

27. An Automatic Gain Control (AGC) apparatus of controlling a wireless receiver having a gain of a Low Noise Amplifier (LNA) and a gain of a Variable Gain Amplifier (VGA) for determining a final gain setting LNAFinal and VGAFinal of the LNA and VGA, comprising:
  means for setting initial gains for the LNA and the VGA corresponding to a maximum gain;
  means for detecting and determining whether the power of a received RF signal is within a valid receiving range;
  means for coarse-tuning the gains of the LNA and the VGA according to a subsequent preset value if the power of the received RF signal is not within the valid receiving range; wherein a plurality of preset values for the gains are arranged in order so that the subsequent preset value is lower than the antecedent preset value;
  means for computing an average power of the received RF signal; and
  means for fine-tuning the gain of the VGA to be VGAFinal according to a difference between the average power and a threshold;
  wherein the detecting and determining means requests the coarse-tuning means to tune the gains of the LNA and VGA again if the power of the received RF signal is still outside the valid receiving range, else fixes the current gain of the LNA as LNAFinal.

28. The AGC apparatus according to claim 27, wherein the valid receiving range is set according to an ideal 16-point average power predetermined by the system.

29. The AGC apparatus according to claim 27, wherein the AGC apparatus is operated in digital computation.

30. The AGC apparatus according to claim 27, wherein the average power level is obtained by calculating a 32-point average power of the signal.

31. The AGC apparatus according to claim 30, wherein the threshold is determined by an ideal power level of 32 sample points.

32. The AGC apparatus according to claim 27, further comprising:
  means for recalculating the average power level and tuning the gain of the VGA according to a difference between the recalculated average power level and the threshold.

* * * * *